United States Patent
Valenzuela et al.

(10) Patent No.: US 7,278,474 B2
(45) Date of Patent: Oct. 9, 2007

(54) HEAT EXCHANGER

(75) Inventors: Javier A. Valenzuela, Grantham, NH (US); Thomas J. Jasinski, Lebanon, NH (US)

(73) Assignee: Mikros Manufacturing, Inc., Claremont, NH (US)

( * ) Notice: Subject to any disclaimer, the term of this patent is extended or adjusted under 35 U.S.C. 154(b) by 86 days.

(21) Appl. No.: 10/266,300

(22) Filed: Oct. 8, 2002

(65) Prior Publication Data

US 2003/0066634 A1 Apr. 10, 2003

Related U.S. Application Data

(60) Provisional application No. 60/328,013, filed on Oct. 9, 2001.

(51) Int. Cl.
*F28F 3/08* (2006.01)

(52) U.S. Cl. .................. 165/167; 165/166; 165/80.5

(58) Field of Classification Search .............. 165/80.4, 165/80.5, 168, 169, 173, 174, 175, 185, 164, 165/165, 166, 167; 257/714; 361/699
See application file for complete search history.

(56) References Cited

U.S. PATENT DOCUMENTS

| | | | |
|---|---|---|---|
| 3,361,195 A | 1/1968 | Meyerhoff et al. ............. 165/80 |
| 4,450,472 A | 5/1984 | Tuckerman et al. ........... 357/82 |
| 4,494,171 A | 1/1985 | Bland et al. ................. 361/386 |
| 4,880,055 A | 11/1989 | Niggemann et al. ........ 165/167 |
| 5,005,640 A | 4/1991 | Lapinski et al. ............. 165/170 |
| 5,016,707 A | 5/1991 | Nguyen ........................ 165/167 |
| 5,029,638 A | 7/1991 | Valenzuela ................... 165/164 |
| 5,088,005 A | 2/1992 | Ciaccio ........................ 361/385 |
| 5,099,311 A | 3/1992 | Bonde et al. ................. 357/82 |
| 5,145,001 A | 9/1992 | Valenzuela ................... 165/164 |
| 5,269,372 A | 12/1993 | Chu et al. .................... 165/80.4 |
| 5,309,319 A | 5/1994 | Messina ....................... 361/699 |
| 5,429,183 A | 7/1995 | Hisamori et al. ............ 165/134.1 |

(Continued)

OTHER PUBLICATIONS

L.S. Stephens, K.W. Kelly, D. Kountouris & J. McLean, "A Pin Fin Microheat Sink for Cooling Macroscale Conformal Surfaces Under the Influence of Thrust and Frictional Forces", Journal of Microelectromechanical Systems, vol. 10, No. 2, Jun. 2001, pp. 222-231.

(Continued)

*Primary Examiner*—Ljiljana Ciric
(74) *Attorney, Agent, or Firm*—BainwoodHuang

(57) ABSTRACT

A heat exchanger (HX) (120) utilizing a working fluid and having a high heat flux transfer capacity. The HX comprises a core (130) having a heat transfer surface (128), a length and a width. Inlet manifolds (140) and outlet manifolds (142) located alternatingly across the width of the core extend the length of the core. Interconnecting channels (144) each fluidly communicate with a corresponding outlet manifold and the two inlet manifolds located immediately adjacent that outlet manifold. Heat exchanger fin (154) in thermal communication with the heat transfer surface (128) generally defines the surface of the interconnecting channels. A pathway directs the working fluid first towards and then away from heat transfer surface (128) in a direction substantially normal to the heat transfer surface. Heat is transferred to or from the working fluid from heat transfer fin (154) as the fluid flows toward and away from the heat transfer surface.

12 Claims, 6 Drawing Sheets

U.S. PATENT DOCUMENTS

| | | | |
|---|---|---|---|
| 5,727,618 A | 3/1998 | Mundinger et al. | 165/80.4 |
| 5,835,345 A | 11/1998 | Staskus et al. | 361/699 |
| 5,836,383 A | 11/1998 | Zwittig | 165/167 |
| 5,843,385 A | 12/1998 | Dugan | 422/191 |
| 6,005,772 A | 12/1999 | Terao et al. | 361/699 |
| 6,167,952 B1 | 1/2001 | Downing | 165/167 |
| 6,695,044 B1 * | 2/2004 | Symonds | 165/166 |
| 6,959,492 B1 * | 11/2005 | Matsumoto et al. | 165/166 |
| 6,994,829 B2 * | 2/2006 | Whyatt et al. | 165/165 |
| 7,111,672 B2 * | 9/2006 | Symonds | 165/164 |

OTHER PUBLICATIONS

Y. Murakami & B.B. Mikic, "Parametric Optimization of Multichanneled Heat Sinks for VLSI Chip Cooling", IEEE Transactions on Components and Packing Technologies, vol. 24, No. 1, Mar. 2001, pp. 2-9.

L. Jiang, M. Wong & Y. Zohar, "Forced Convection Boiling in a Microchannel Heat Sink", Journal of Microelectromechanical Systems, vol. 10, No. 1, Mar. 2001, pp. 80-87.

J. Darabi, M.M. Ohadi & D. DeVoe, "An Electrohydrodynamic Polarization Micropump for Electronic Cooling", Journal of Microelectromechanical Systems, vol. 10, No. 1, Mar. 2001, pp. 98-106.

C. Perret, J. Boussey, C. Schaeffer & M. Coyaud, "Analytic Modeling, Optimizing, and Realization of Cooling Devices in Silicon Technology", IEEE Transactions on Components and Packaging Technologies, vol. 23, No. 4, Dec. 2000, pp. 665-672.

D. Copeland, "Manifold Microchannel Heat Sinks: Analysis and Optimization", ASME/JSME Thermal Engineering Conference: vol. 4, 1995, pp. 169-174.

D. Copeland, H. Takahira, W. Nakayama & B. Pak, "Manifold Microchannel Heat Sinks: Theory and Experiment", Advances in Electronic Packing, EEP-vol. 10-2, 1995, pp. 829-835.

A. Weisberg, H.H. Bau & J.N. Zemel, "Analysis of microchannels for integrated cooling", Int. J. Heat Mass Transfer, 1992, vol. 35, No. 10, pp. 2465-2474.

D.B. Tuckerman & R.F.W. Pease, "High-Performance Heat Sinking for VLSI", IEEE Electron Device Letters, May 1981, vol. EDL-2, No. 5, pp. 126-129.

* cited by examiner

HEAT EXCHANGER

RELATED APPLICATION

This application claims the benefit of U.S. Provisional Patent Application Ser. No. 60/328,013, filed Oct. 9, 2001, entitled "Candy Cane Heat Exchanger", which is hereby incorporated by reference in its entirety as if fully disclosed herein.

FIELD OF THE INVENTION

The present invention relates generally to heat transfer devices. More particularly, the present invention is directed to a heat exchanger.

BACKGROUND OF THE INVENTION

Heat exchangers that utilize a single-phase working fluid to transfer heat from a heat source or to a heat sink are known as single-phase heat exchangers. Single-phase heat exchangers are used in a variety of applications ranging from radiators of conventional automobiles to more exotic water-to-ammonia heat exchangers for sustaining life in outer space, e.g., aboard a space shuttle or a space station. Single-phase heat exchangers are also used in other diverse applications, such as removing waste heat from electronic devices, e.g., microprocessors, cooling fusion reactor diverters and producing slush hydrogen.

Compact single-phase heat exchangers are particularly desirable in applications having relatively high heat fluxes. For example, the continually increasing speeds and complexity of microprocessors cause these microprocessors to generate commensurately increasing amounts of heat. Present generation microprocessors typically have heat fluxes in the range of 5 watts/cm$^2$ to 15 watts/cm$^2$. The next several generations of microprocessors are predicted to have much greater heat fluxes, e.g., on the order of 50 watts/cm$^2$ to 200 watts/cm$^2$ or more. One type of compact heat exchanger contemplated for high flux heat transfer applications is what has become known as a normal-flow heat exchanger (NFHX). Specific embodiments of NFHXs have been previously disclosed by the present inventor, e.g., in U.S. Pat. Nos. 5,029,638, 5,145,001, and U.S. patent Publication No. US-2001-0050162-A1, all of which are incorporated by reference in their entirety as if fully disclosed herein. An NFHX is desirable for applications such as microprocessor cooling because it provides: (1) a single phase heat exchanger having a high surface heat flux capability; (2) a compact heat exchanger in which the working fluid experiences a generally small pressure drop as it passes through the heat exchanger; and (3) a small and lightweight heat exchanger having a high thermal transfer effectiveness.

FIG. 1 shows an alternative heat exchanger plate 20 that may be used to form the core of a NFHX as taught in U.S. patent Publication No. US-2001-0050162-A1. Heat exchanger plate 20 is configured such that a separate spacer plate is not required between adjacent heat exchanger plates. Heat exchanger plate 20 has inlet apertures 22 and outlet apertures 24 for respectively defining portions of inlet and outlet manifolds 26, 28 of the core. However, instead of the interconnecting channels being substantially defined by apertures in a spacer plate, interconnecting channels 30 are defined by recessed regions 32 formed in heat exchanger plate 20. Accordingly, webs 34, marginal regions 36 and partitions 38 of heat exchanger plate 20 are each defined by the full thickness of the material from which the heat exchanger plate is made and fins 40 are defined by a partial thickness of the material. Because portions of heat exchanger plate 20 are full thickness and other portions are partial thickness, a separate spacer plate is not required. It will be understood that heat exchanger plate 20, however, can likewise be comprised of two separate plates, namely a first plate that corresponds to the partial thickness portions and a spacer plate that corresponds to the full thickness regions.

In an NFHX 20 incorporating one or more plates 20, fluid enters NFHX 20 and flows through inlet manifold 26. Fluid then flows down through recessed region 32 and over fins 40 toward (in a direction normal to heat transfer surface 21, hence the name) the heat transfer surface 21 that forms the bottom of NFHX 20. Next, fluid flows away from heat transfer surface 21 and enters interconnecting channels 30 and exits NFHX 20 via outlet manifolds 28.

Heat exchanger plate 20 includes an arrangement of inlet and outlet apertures 22, 24 that locates the majority of flow area within the inlet and outlet manifolds distal from heat transfer surface 21. This arrangement avoids placing significantly-sized apertures adjacent heat transfer surface 21 as taught in U.S. Pat. Nos. 5,029,638 and 5,145,001. Such apertures adjacent heat transfer surface 21 reduce the heat transfer efficiency of plate 20 by reducing the size of fins 40 and/or the cross-sectional area between the heat transfer surface and the fins available for conducting heat therebetween.

Prior art heat exchangers such as NFHX 20 were typically designed so that the temperature gradient in the fluid was aligned with the temperature gradient in the fin (i.e., all the heat transfer to the fluid occurs as the fluid moves towards the heat transfer surface). This was believed to be required to maximize thermal performance of the heat exchanger. In order to align the temperature gradients of the fluid and fins, prior art heat exchangers necessitated certain structural limitations.

In order to maximize heat transfer performance of the heat exchanger NFHX 20, it is desired that the width (transverse to the flowing fluid) of fin 40 utilize as much as practical the full width of the heat exchanger. One example of the aforementioned structural limitations is that the flow area within interconnecting channel 30 reduces the width available for heat exchanging fins 40. In addition, because of the prior art design philosophies with respect to temperature gradients, it was not deemed to be necessary or efficient to include fins 40 within interconnecting channels 30 or in any area where the fluid is flowing away from heat transfer surface 21.

Although the design in FIG. 1 did improve upon previous NFHX designs, the relatively narrow interconnecting channels 30 that are necessary to maximize the area of fins 40 causes an increase the overall pressure drop through NFHX 20. The increased pressure drop within interconnecting channels 30 can cause flow maldistribution over fins 40 thereby degrading heat transfer capabilities. In addition, larger pumps or other more expensive means may be required to increase the inlet pressure as a result of the increased pressure drop. The competition between overall fin area and resulting increased pressure drop ultimately limits the overall performance of prior art heat exchangers such as NFHX 20.

SUMMARY OF THE INVENTION

The present invention includes novel heat exchanger devices, assemblies, and methods that reduce the pressure drop across the heat exchanger while simultaneously improving thermal performance thereby increasing the overall heat transfer capacity of the device.

The present invention is a heat exchanger with a housing having a length, a width, a height, and multiple surfaces including at least one heat transfer surface. The housing includes at least two openings for receiving and expelling exchanger fluids. There is at least one heat exchanger plate located within the housing. The at least one heat exchanger plate has at least two apertures defining at least two manifolds. Each of the at least two manifolds is in fluid communication with at least one of the at least two openings. In addition, there is at least one interconnecting channel defined within the at least one heat exchanger plate. The at least one interconnecting channel fluidly couples together the at least two manifolds. The at least one interconnecting channel includes a first portion adapted to direct fluids in a first direction toward the at least one heat transfer surface and a second portion adapted to direct fluids in a second direction away from the at least one heat transfer surface.

In still another embodiment of the present invention, the invention includes a heat exchanger having a housing with at least one heat transfer surface and one or more heat transfer fins extending into the housing. The heat transfer fins are in thermal communication with the heat transfer surfaces and extend into the housing where they terminate at a top edge a certain distance from the heat transfer surface. In addition, a fluid flow path for guiding fluids through the housing is defined within the housing. The flow path includes a first portion adapted to direct fluids in a first direction toward the heat transfer surfaces and a second portion adapted to direct fluids in a second direction away from the heat transfer surfaces. In at least one embodiment, the distance from the heat transfer surface to the top edge of the heat transfer fin in the second portion is either greater or less than the distance from the heat transfer surface to the top edge of the heat transfer fin in the first portion.

In further embodiments of the present invention, the heat exchanger described above may be part of an assembly having a device in thermal communication with the heat transfer surfaces of the exchanger and the heat exchangers described above may be used in a method for transferring heat to or from the device.

A more complete appreciation of the present invention and its scope can be obtained from understanding the accompanying drawings, which are briefly summarized below, the following detailed description of the presently preferred embodiments of the invention, and the appended claims.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

The heat exchangers of the present invention have been devised with the short-comings of prior art heat exchangers in mind. The primary short-coming of prior art heat exchanger NFHX 20 and other heat exchangers is level of overall pressure drop in the fluid across the particular heat exchanger device. In addition to adversely impacting the heat transfer capacity of a fluid, increased pressure drop requires the use of larger inlet pumping devices thereby increasing operational costs. In addition, the area required by interconnecting channels 30 in NFHX 20 is not effectively utilized for the transfer of heat and therefore limits the effectiveness of overall heat exchange.

Figure 1:
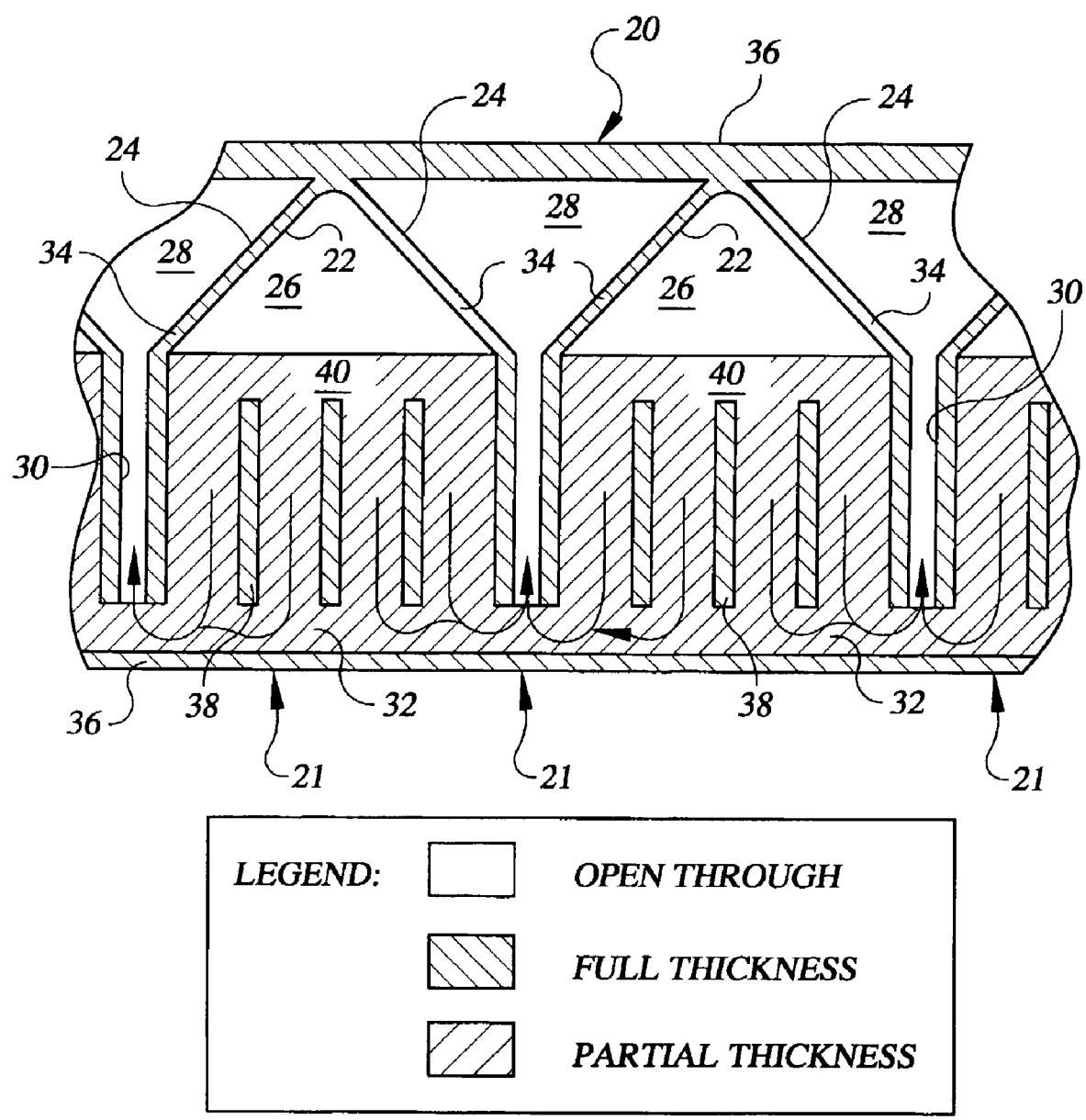
FIG. 1 is an elevational view of a prior art heat exchanger plate that may be used to form the core of a normal flow heat exchanger.

As explained earlier, prior art heat exchangers were designed so that the temperature gradient of the fluid was in alignment with the temperature gradient of the device itself. As a result, the size (and surface area) of heat transfer fins 40 (see FIG. 1) was maximized in areas where fluid was flowing in the normal direction toward heat transfer surfaces 21. Conversely, the size of the interconnecting channels 30 was reduced in the areas where the fluid flowed away from heat transfer surface 21. Such a design resulted in an increased overall pressure drop across the device because of the narrowing of interconnecting channels 30 to maximize the surface area of fins 40.

It is now realized that the surface area of fins 40 need not be maximized. Rather, the overall surface area of heat transfer fins 40 regardless of the direction of flow is important with respect to thermal performance. That is, fluid flowing in the normal direction away from heat transfer surfaces 21 is equally effective with respect to thermal performance as fluid flowing in the normal direction toward heat transfer surfaces 21. Because of this, it becomes advantageous to widen interconnecting channels 30 to increase the flow area within those channels. The widening of channels 30 results in a reduction of fluid velocity and fluid pressure within the channels thereby reducing the overall pressure drop across the heat exchanger. In addition, the widening of channels 30 does not sacrifice thermal performance because heat transfer fins 40 are added to interconnecting channels 30 in the present invention thereby increasing the overall surface area of fins 40 and consequently the overall thermal effectiveness of the heat exchanger.

Figure 2:
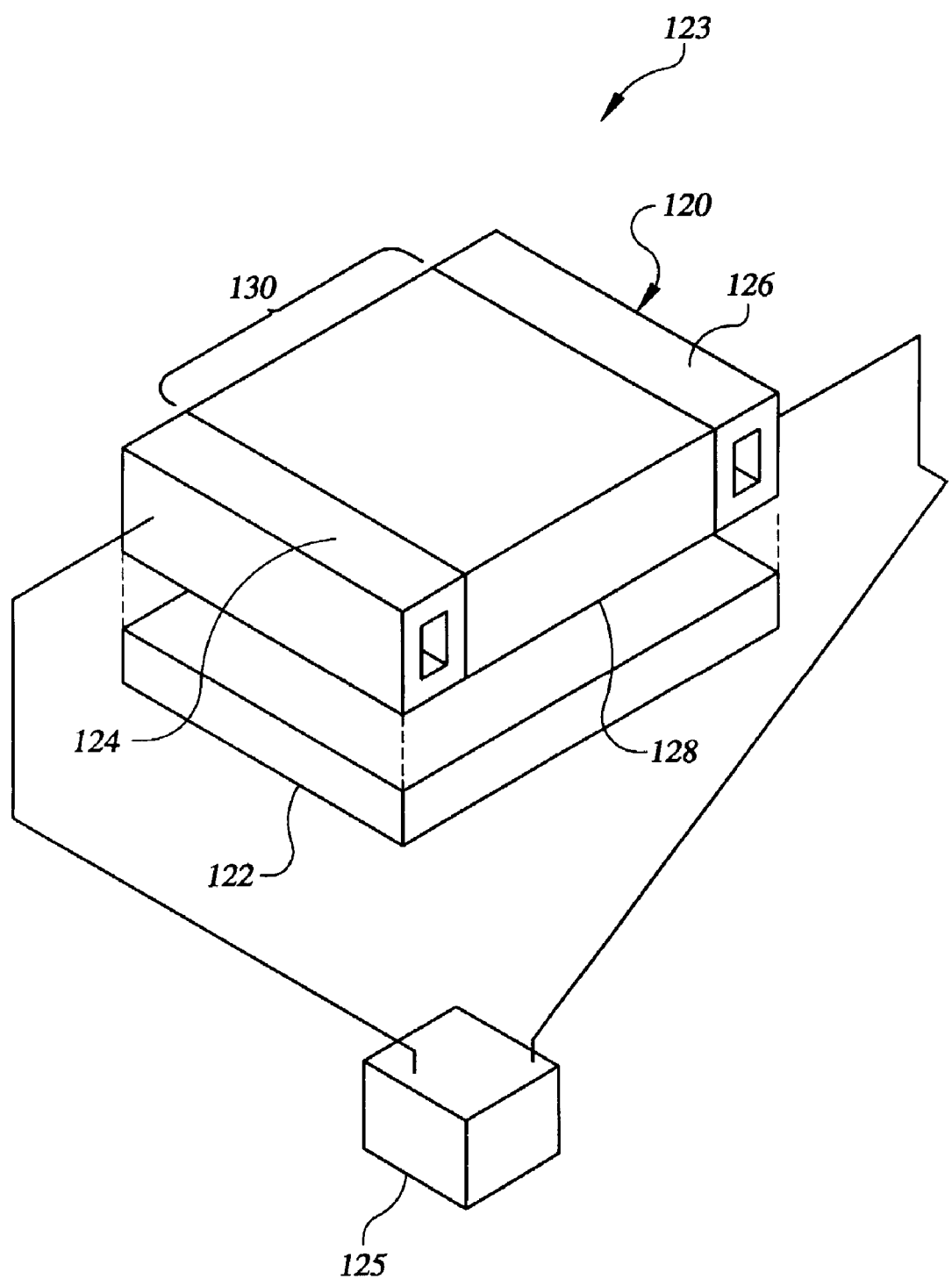
FIG. 2 is a perspective view of a heat exchanger of the present invention, shown located adjacent a device from, or to, which heat may be transferred by the heat exchanger.

Referring now to the drawings, wherein like numerals indicate like elements, FIG. 2 shows in accordance with the present invention a heat exchanger (HX), which is generally denoted by the numeral 120. HX 120 is adapted for utilizing a heat transfer, or working, fluid, such as water, ammonia and refrigerants such as R-134, among others, to remove heat from, or provide heat to, a device 122 in thermal communication with the HX. In one embodiment, device 122 is a microprocessor that generates waste heat. Examples of other devices with which HX 120 may be used for removing heat include other electronic devices, or laser diode arrays, among others. Alternatively, device 122 may require input of heat, such as a radiator panel for the living quarters of a space vehicle or space station, among others. One skilled in the art will recognize the diverse applications for HX 120 of the present invention, and that an exhaustive recitation of such applications need not be presented herein.

HX 120 is preferably part of a closed heat transfer circuit 123 having a flow recirculation system 125 for providing the working fluid to and conducting the working fluid away from, the HX. The recirculation systems also exchanges energy with some other medium so as to maintain constant the temperature of the fluid supplied to HX 120. Accordingly, HX 120 includes an inlet plenum 124 for receiving the working fluid from re-circulation system 125 and an outlet plenum 126 for returning the working fluid to the re-circulation system. HX 120 also includes a heat transfer surface 128 that may be adapted for thermally communicating with device 122 so that heat can flow between HX 120 and the device. For example, heat transfer surface 128 may directly contact device 122 or may be in thermal communication therewith through an intermediate material (not shown), such as an adhesive, thermal grease, or a compliant pad, among others. As described below in detail, HX 120 contains internal passageways for directing the flow of the working fluid through the HX. The internal passageways may be configured to provide HX 120 with heat transfer capacity at high heat fluxes, while maintaining a compact overall size, which may be on the order of the size of a microprocessor chip. In some embodiments, HX 120 may be designed to handle heat fluxes of 1,000 watts/cm$^2$ or more. In addition and as described below, HX 120 may be made from a plurality of precisely-formed plates stacked with one another to form the unitary structure of the HX. Such precise forming is particularly desirable for making HX 120 relatively very small while providing a relatively high heat flux capacity.

Figure 3:
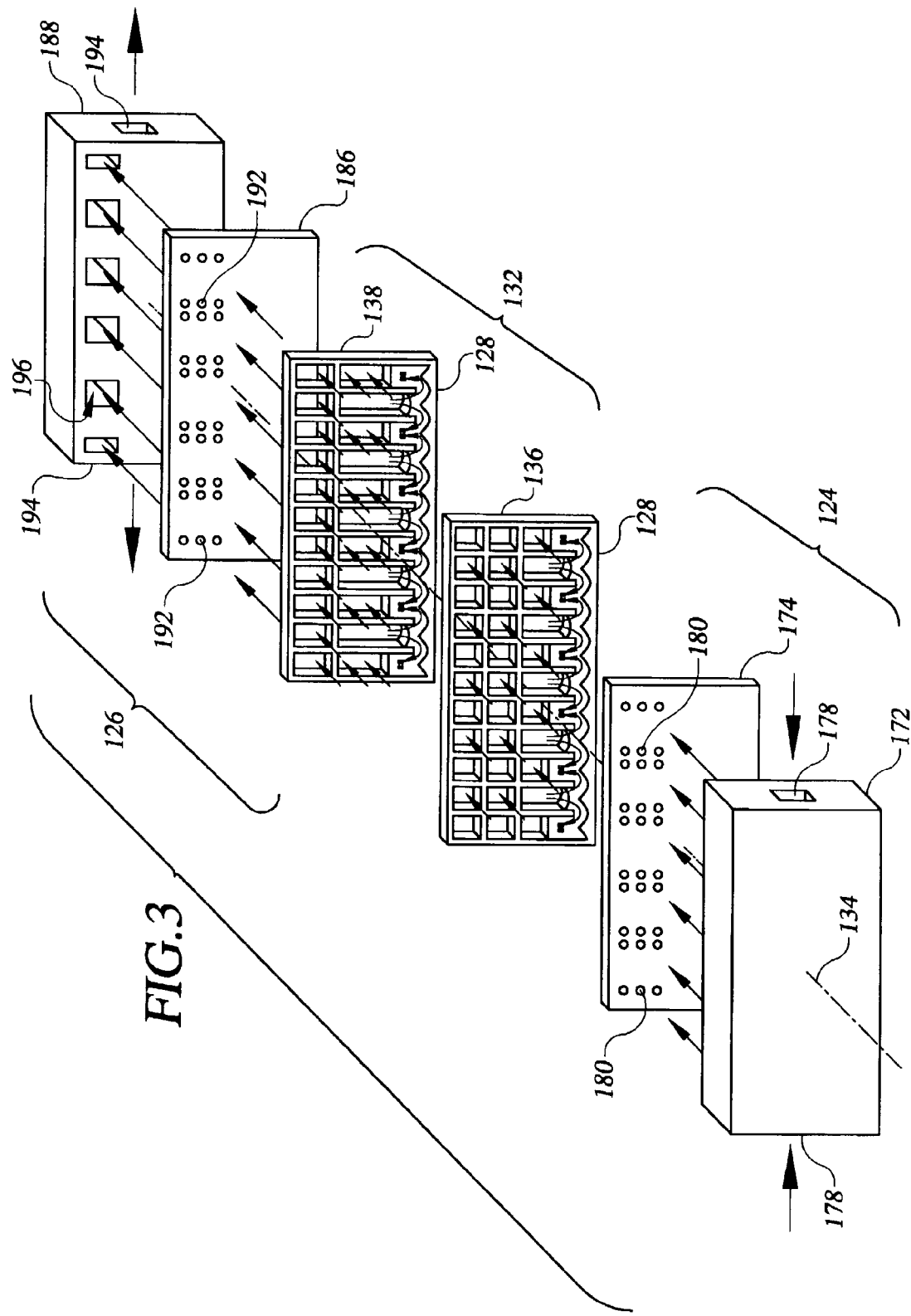
FIG. 3 is an exploded perspective view of a laminated embodiment of a heat exchanger of the present invention.

Referring now to FIGS. 2-5, HX 120 has a core 130 that may include a plurality of plate pairs 132 stacked with one another along a stacking axis, such as stacking axis 134 extending through inlet and outlet plena 124, 126 of HX 120. Each plate pair generally comprises a heat exchanger plate 136 and a heat exchanger plate 138. Although FIG. 3 shows only one plate pair 132, it is to be understood that core 130 will typically contain many of such plate pairs, e.g., 50 pairs or more, stacked in registration with one another to form the various below-described passageways therein. When properly stacked, the plurality of plate pairs 132 may define multiple inlet manifolds 140 extending the length of core 130, multiple outlet manifolds 142 extending the length of the core, and a plurality of interconnecting channels 144 fluidly communicating with at least one inlet manifold at one end and at least one outlet manifold at the opposite end. One skilled in the art will recognize that the particular number of inlet and outlet manifolds shown is merely illustrative. Any number of inlet and outlet manifolds may be provided. In addition, one skilled in the art will understand that the terms "inlet" and "outlet" as used herein, and in the claims appended hereto, are interchangeable with one another. For example, what is designated as an inlet manifold for flow in one direction will become an outlet manifold for flow in the opposite direction.

If the stacking axis is parallel to the longitudinal axis 134 of inlet and outlet manifolds 140, 142 as shown, the number of plate pairs 132 required will generally be a function of the desired operating characteristics of HX 120 and the thicknesses of heat exchanger plates 136, 138. Although HX 120 is shown as having plate pairs 132 each comprising a single heat exchanger plate 136 and a single heat exchanger plate 138, one skilled in the art will appreciate that each heat exchanger plate may be a composite of two or more like-shaped plates. This may be desirable when the thickness of the sheet materials from which plates are made is less than the desired thickness of the corresponding plate. One skilled in the art will also appreciate that a single plate may be used in lieu of plate pairs 132. Techniques for forming such a plate are described below in connection with plate 236 of FIG. 6. The stacking axis may be in a direction orthogonal to longitudinal axis 134. For example, the stacking axis may be in a direction normal to heat transfer surface 128. In such a case, the configurations of each stacked plate will be much different from plates 136, 138 shown in FIG. 3 and will have other criteria, such as the ability to form the passageways therein, limiting the number of such plates needed.

Figure 4:
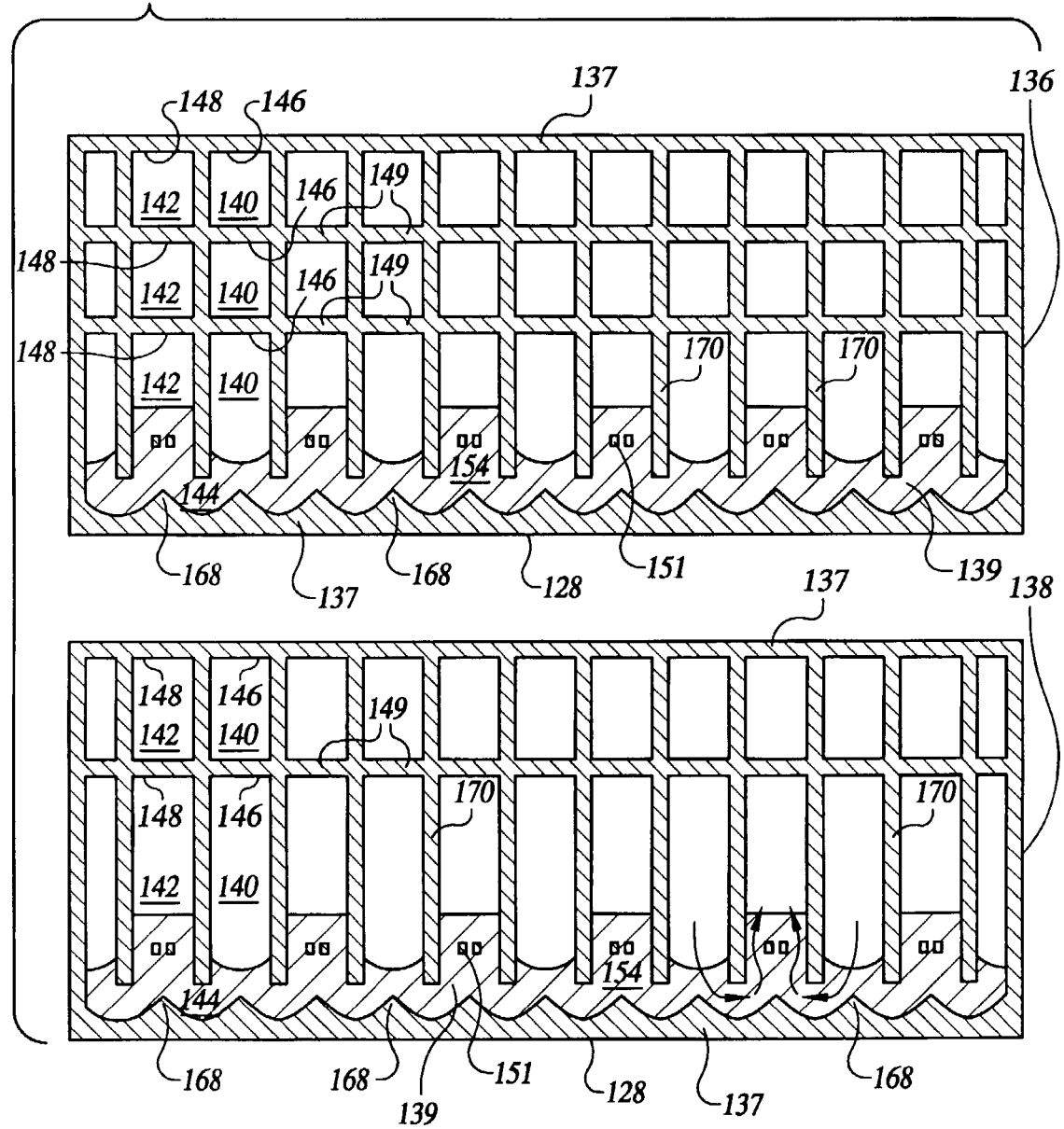
FIG. 4 is an elevational view of a heat exchanger plate having double-braced manifolds and an elevational view of a corresponding heat exchanger plate having single-braced manifolds that may be used to form the core of the heat exchanger shown in FIG. 2.

As shown in FIG. 4, different cross-hatching is used to represent different material thicknesses in heat exchanger plates 136, 138. For both heat exchanger plates 136 and 138, the narrowly-spaced hatching represents portions 137 of the plate that include the full thickness of the material used to fabricate the plate. Also in plates 136, 138, the wider-spaced hatching represents portions 139 of the plate that include only a partial thickness of the material used to fabricate the plate. The hatching in plates 136, 138 are opposite one another to highlight the overlapping portions of each plate 136, 138 when stacked together as in FIG. 5.

As best seen in FIG. 4, each heat exchanger plate 136, 138 may include multiple inlet apertures 146 that each define a portion of a corresponding one of inlet manifolds 140. Each heat exchanger plate 136, 138 may also include multiple outlet apertures 148 that each define a portion of a corresponding one of outlet manifolds 142. The recessed portions 139 of plates 136, 138 that include only a partial material thickness form interconnecting channels 144 where the fluids flowing from inlet manifolds 140 change direction and flow into outlet manifolds 142, as described in more detail below.

With continuing reference to FIG. 4, both inlet manifolds 140 and outlet manifolds 150 may include one or more braces 149 that serve to strengthen the structural integrity of the manifolds. In the embodiment illustrated in FIG. 4, heat exchanger plate 136 includes manifolds 140, 142 that each have two braces 149, and heat exchanger plate 138 includes manifolds 140, 142 that each have a single brace 149.

Figure 5:
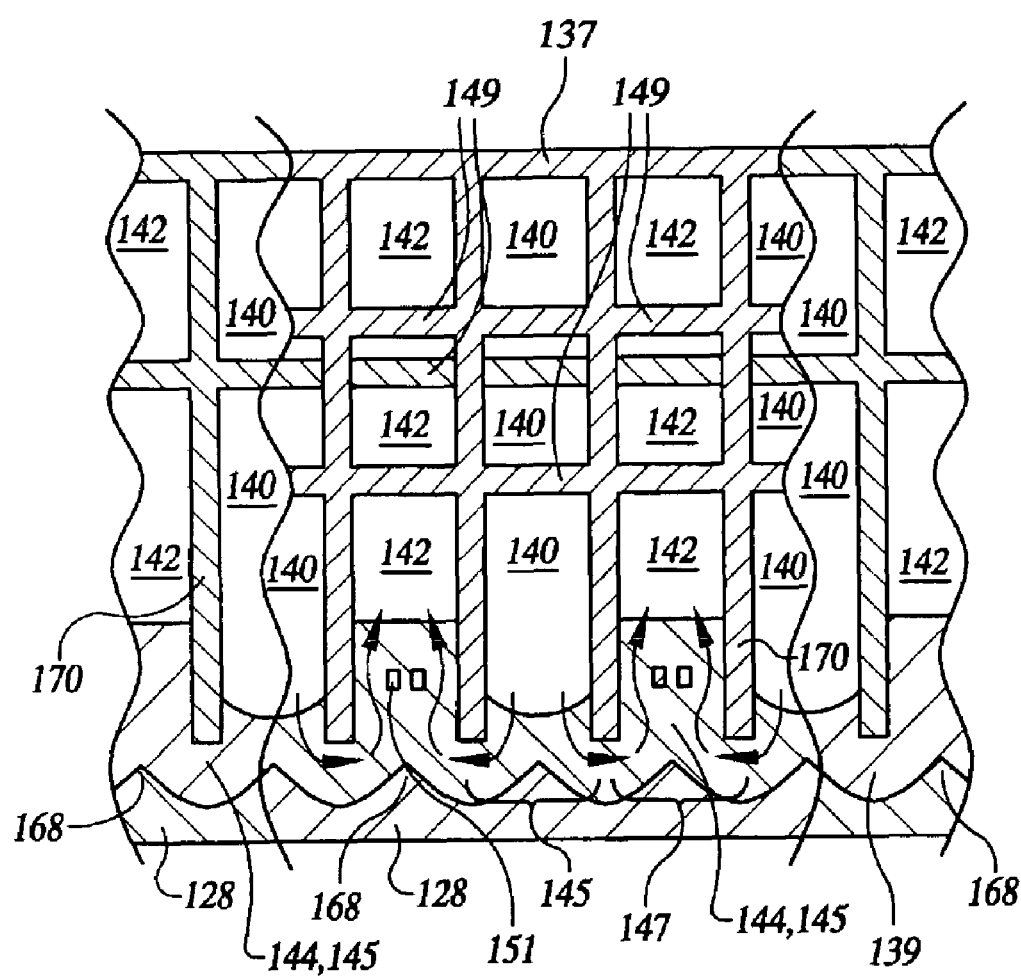
FIG. 5 is a partial elevational view of the heat exchanger plates of FIG. 4 in proper registration with one another, showing the flow passageways defined thereby.

FIG. 5 shows one pair of heat exchanger plates 136, 138 in proper registration with one another to illustrate how inlet manifold 140 and outlet manifold 142 are defined by the pair of plates. FIG. 5 also shows how the overlap of each inlet manifold 140 portion and outlet manifold 142 portion on plate 136 with the corresponding manifold portions 140, 142 on plate 138 facilitates fluid communication between the inlet manifold portions 140 of each plate and the outlet manifold portions 142 of each plate. When plate 136 is stacked on top of plate 138, the staggered placement of brace 139 on plate 138 with respect to braces 139 on plate 136 allows fluid in inlet and outlet manifold 140, 142 to communicate along the length of core 130.

Interconnecting channels 144 may include a first portion 145 that extends from inlet manifold 140 to heat transfer surface 128 and a second portion 147 that extends from heat transfer surface 128 to outlet manifold 142. Typically, fluid enters the HX through inlet manifold 140, flows into the first portion of interconnecting channel 144, flows through the first portion toward heat transfer surface 128, enters a second portion of interconnecting channel 144 where it is directed away from heat transfer surface 128 and into outlet manifold 142. Channels 144 are in thermally conductive communication with heat transfer surface 128 and serve as heat transfer fins 154, since it is at these regions that the majority of heat is transferred between core 130 and the working fluid.

Each interconnecting channel 144 may optionally include one or more flow partitions 168, e.g., for helping direct and/or dividing the flow from one inlet manifold 140 to two or more outlet manifolds 142. In addition, one or more flow guide tabs 151 may be included within recessed portions 139. In some embodiments, such as that illustrated in FIG. 6, no guide tabs may be included. In other embodiments, more than two guide tabs may be included. As recognized by one skilled in the art, the necessity for one or more guide tabs will typically be based on the aspect ratio of the heat exchanger channel.

Both flow partitions 168 and flow guide tabs 151 promote more uniform flow distribution over the heat transfer channel (known collectively as flow control elements 151, 168). Flow control elements 151, 168 help distribute the flow over the width of the outlet manifolds 142. Flow control elements 151, 168 may also be used to control the amount of the working fluid flowing through an individual interconnecting channel 144. Accordingly, flow control elements 151, 168 may be used to control the heat transfer capacity of each fin 154.

For example, in the embodiment shown, heat exchanger plates 136, 138 contain inlet and outlet apertures 146, 148 (defining manifold portions 140, 142) that are large relative to the overall area of the heat exchanger plates. Thus, interconnecting channels 144 are relatively wide and are separated from inlet and outlet apertures 146, 148 by relatively narrow webs 170. These characteristics maximize the area of each fin 154 exposed to the working fluid and maximize the flow in corresponding interconnecting channel 144, thereby maximizing the heat transfer capacity at that fin, all other variables being equal. However, in alternative embodiments, the size of flow control elements 151, 168, and/or webs 170, may be increased to decrease the area of the corresponding fin 154 exposed directly to the working fluid and to decrease the flow in corresponding interconnecting channel 144, thereby decreasing the heat transfer capacity at that fin.

Accordingly, a designer of HX 120 of the present invention can vary the heat transfer efficiency of core 130 both along the length and width of heat transfer surface 128 to be commensurate with the heat transfer needs of the various regions of device 122. For example, device 122 may require maximum cooling power along a central strip extending the length of heat transfer surface but only minimal cooling power at adjacent edge strip regions. Accordingly, flow control elements 151, 168 and/or webs 170 adjacent the center ones of inlet and outlet apertures 146, 148 in heat exchanger plate 136, 138 along the length of core 130 would be relatively narrow, creating wide interconnecting channels 144 having relatively high heat transfer capacity along the center of the core. In contrast, flow control elements 151, 168 and/or webs 170 adjacent the inlet and outlet apertures 146, 148 outboard of the center apertures would be relatively wide, creating narrow interconnecting channels 144 having relatively low heat transfer capacity adjacent the lateral margins of core 130.

In one embodiment, outlet manifolds 142 are located alternatingly with inlet manifolds 140 across the width of core 130, as shown, and are provided in a number one less than the number of the inlet manifolds. This arrangement allows each interconnecting channel 144 to fluidly communicate with one inlet manifold 140 on the upstream portion of channel 144 and the two immediately adjacent outlet manifolds 142 on the downstream portions of channel 144.

One skilled in the art will appreciate that, if desired, outlet manifolds 142 may be provided in a number one greater than inlet manifolds. In addition, inlet and outlet manifolds 140, 142 may be provided in any other configuration and in any number desired, including alternating arrangements wherein e.g., more than one outlet manifold 142 is located between immediately adjacent inlet manifolds. In one embodiment, the composite volume consisting of the volume of inlet manifolds 140 and the volume of outlet manifolds 142 makes up at least 20% of the total volume of core 130 HX 120. In another embodiment, the composite volume of inlet and outlet manifolds 140, 142 makes up 30% or more of the total volume of core 130. Even larger composite volumes of inlet and outlet manifolds 140, 142 may be desirable in terms of reducing the pressure drop within the inlet and outlet manifolds. Also, one skilled in the art will appreciate that composite volumes smaller than 20% of the total volume of core 130 may be necessary to satisfy one or more other criteria, such as constraints on the overall size of HX 120.

Referring particularly to FIGS. 2 and 3, inlet plenum 124 receives the working fluid from flow re-circulation system 125 and distributes it among inlet manifolds 140. Inlet plenum 124 includes a combination inlet cover and inlet plenum plate 172, and an inlet wall plate 174. Inlet cover/plenum plate 172 contains an inlet port 178 for receiving the working fluid from flow re-circulation system 125. Inlet wall plate 174 is configured to evenly distribute the working fluid only to inlet manifolds 140, blocking the working fluid from entering outlet manifolds 142. Thus, inlet wall plate 174 contains multiple inlet apertures 180 in registration with inlet manifolds 140 of core 130. Inlet cover/plenum plate 172 may include a single plenum aperture (not shown) that, when inlet plenum 124 is assembled, forms a plenum channel (not shown) that fluidly communicates with inlet port 178 and inlet apertures 180. Similar to heat exchanger plates 136, 138 of core 130, one or more of plates 172, 174 of inlet plenum 124 may be composite plates consisting of two or more like-shaped plates to provide the necessary overall plate thickness and/or required dimensions of the apertures formed within the plates.

Outlet plenum 126 collects the working fluid from outlet manifolds 142 and returns it to flow re-circulation system 125. Outlet plenum 126 includes an outlet wall plate 186, a combination outlet cover and outlet plenum plate 188. Outlet wall plate 186 blocks the working fluid from flowing out of inlet manifolds 140 and, thus, contains multiple outlet apertures 192 in registration with outlet manifolds 142 of core 130. Outlet cover/plenum plate 188 contains an outlet port 194 for returning the working fluid to flow re-circulation system 125. Outlet cover/plenum plate 188 may include a single plenum aperture 196 that, when outlet plenum 126 is assembled, forms a plenum channel (not shown) that fluidly communicates with outlet apertures 192 and outlet port 194. Similar to plates 172, 174 of inlet plenum 124 one or more of plates 186, 188 may be composite plates consisting of two or more like-shaped plates to provide the necessary overall plate thickness and/or required dimensions of the apertures formed within the plates. The configurations of inlet and outlet plena 124, 126 shown providing HX 120 with working fluid inflow at one end and outflow at the opposite end is merely illustrative. One skilled in the art will appreciate that inlet and outlet plena 124, 126 may be reconfigured to provide, e.g., working fluid inflow and outflow at one or both ends of HX 120, along one or both sides of HX 120 that are perpendicular to the ends and heat transfer surface 128, or at one or both the upper and lower surfaces of the HX 120.

Heat exchanger plates 136, 138 may be made of a material having a high thermal conductivity, such as copper or aluminum. In some applications, it may be desirable to minimize the thermal strain mismatch between HX 120 and device 122 (see FIG. 2). For example, when device 122 is a silicon-based microprocessor and HX 120 is provided for cooling the microprocessor, a thermal strain mismatch between, e.g., a copper heat exchanger plate and the microprocessor can cause mechanical failure in the microprocessor, which has a coefficient of thermal expansion much lower than copper. However, other materials are available that have good thermal conductivity and relatively low coefficients of thermal expansion and may be suitable for heat exchanger plates 136, 138. Examples of such materials include composites of copper-tungsten, copper molybdenum, and aluminum-silicon carbide. Use of these materials would allow direct bonding of HX 120 to a microprocessor or other silicon or similar material based device 122.

Plates 172, 174 of inlet plenum 124 and plates 186, 188 of outlet plenum 126 are preferably made of the same material as heat exchanger plates 136, but may be made of a different material.

In one embodiment, plates 136, 138, 172, 174, 186, 188 of HX may have thicknesses in the sub-millimeter regime. Accordingly, plates 136, 138, 172, 174, 186, 188 may be made from foil. However, some or all of the plates may have thicknesses greater than one millimeter and accordingly may be made from sheet or plate material. Apertures 146, 148, 180, 182, 192, 196 and ports 178, 194 may be formed in the foil using a material removal technique, such as chemical milling, laser ablation, micro-machining, conventional machining or heat cutting, among others. Recessed regions 139 that make up the interconnecting channels 144 may be formed by coining or a material removal technique, such as chemical milling, laser ablation, micro-machining or conventional machining, among others. One skilled in the art will appreciate that the foregoing recess-forming techniques may be used on one or both sides of a plate so that a single plate may take the place of any two or more plates solely having apertures formed therein for defining a particular passageway within a stack of plates. The choice of technique may largely depend upon the thickness and type of the material from which the plates are formed and the limitations of the individual techniques. Plates 136, 138, 172, 174, 186, 188 are be bonded to one another using any suitable bonding technique such as diffusion bonding, brazing, soldering, or adhesive bonding.

In an exemplary embodiment of HX 120 utilizing water as the working fluid and being capable of providing on the order of 250 watts/cm$^2$ of cooling power at a flow rate of approximately 20 cc/s, heat transfer surface 128 may have a length of about 10 mm and a width of about 10 mm. Such an embodiment may be used, e.g., to cool a microprocessor. In this embodiment, all plates 136, 138, 172, 174, 186, 188 are preferably made of copper and the size of interconnecting channels 144 are maximized by minimizing dimensions of flow partitions 168 and webs 170, as described above. Accordingly, the thickness of heat exchanger plates 136, 138 may be on the order of 0.15 mm. The depth of interconnecting channels 144 is on the order of 0.05 mm.

During use, the working fluid flows through HX 120 shown in FIGS. 2-6 as follows. First, the working fluid flows through inlet port 178 and into an inlet plenum channel defined in inlet plenum plate 172, where it is distributed through inlet apertures 180 in inlet wall plate 174 to inlet manifolds 140. As the working fluid flows along each inlet manifold 140, portions of the working fluid flow into the various interconnecting channels 144 distributed along the length of core 130. As the working fluid flows through each interconnecting channel 144, it first flows into the first portion 145 (FIG. 5) of channel 144 adjacent the inlet manifold 140, where it is split into two flow paths by flow partition 168 as it flows toward heat transfer surface 128. The working fluid then flows into a second portion 147 of channel 144 where it flows away from heat transfer surface 128 and into corresponding outlet manifold 142. Once the working fluid enters one of outlet manifolds 142, it then flows through a corresponding one group of outlet apertures 192 in outlet wall plate 186, flows into outlet plenum channel (not shown) in outlet plenum plate 188, and flows through outlet port 194. As one skilled in the art will recognize, the direction of flow through HX 120 may be reversed, whereupon the passageways and openings presently designated as "inlet" become outlet passageways and openings and the passageways and openings presently designated as "outlet" become inlet passageways and openings.

The length of the outlet flow channel 147 is typically twice or more that of the inlet flow channel 145 so that the amount of heat transferred in each channel is the same. The inlet channel has a higher approach temperature difference and hence it needs less area to transfer the same amount of heat as the outlet channel. In other words, by properly selecting the lengths of channels 145 and 147, one half of the temperature rise (drop) of the fluid will occur in the inlet channel 145 and the other half in the outlet channel 147. Thus, the amount of heat transferred in each channel is the same. Using this design methodology, the thermal resistance at the base of HX120 can be made uniform. In other embodiments where thermal resistance uniformity is not a concern, the length of both channels may be the same. Such a design will result in a lower overall pressure drop, but less uniformity of boundary conditions.

Figure 6:
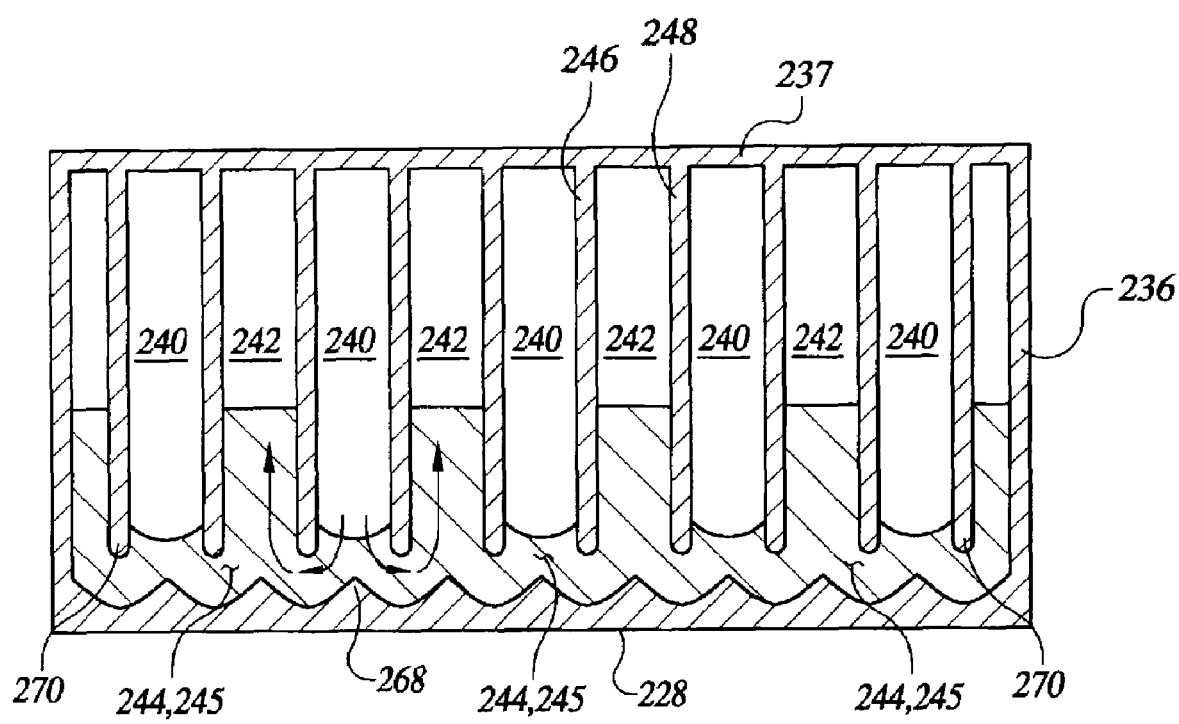
FIG. 6 is an elevational view of an alternative embodiment of a heat exchanger plate that may be used to form the core of the heat exchanger of FIG. 2.

FIG. 6 illustrates another embodiment of the present invention. Heat exchanger plate 236 is similar to plates 136, 138 of FIGS. 4-5 and its elements are numbered accordingly. However, manifold 240, 242 do not include any braces and interconnecting channels 244 do not include any flow guide tabs in the exit channel.

The HX incorporating the heat exchanger plates of the present invention provides advantages over the prior art. First, the thermal resistance is significantly reduced by eliminating the flow collection passages at the heat transfer interface or in between the heat transfer fins. The heat transfer fins in the present invention cover the entire heat transfer interface thereby increasing the heat transfer capacity of the HX. Second, the pressure drop is significantly reduced because the flow collection passages are eliminated. In prior art normal flow heat exchangers, the size of the flow collection passages was made small to reduce their impact on the thermal resistance. A substantial fraction of the pressure drop was associated with ensuring good flow distribution in spite of using small collection passages.

While the present invention has been described in connection with preferred embodiments, it will be understood that it is not so limited. On the contrary, it is intended to cover all alternatives, modifications and equivalents as may be included within the spirit and scope of the invention as defined in the claims appended hereto.

What is claimed is:

1. A heat exchanger for transferring heat to and from a device, the heat exchanger comprising:

a) a heat transfer surface constructed and arranged to transfer heat;

b) a heat exchanger member including at least one inlet manifold, at least one outlet manifold, and at least one interconnecting channel, the at least one interconnecting channel having a heat transfer structure in thermal conductive communication with the heat transfer surface, the at least one interconnecting channel fluidly connecting the at least one inlet manifold to the at least one outlet manifold and including a first portion disposed between a pair of webs and extending between the inlet manifold and the heat transfer surface so as to direct a working fluid flow toward the heat transfer surface in a direction substantially normal thereto and a second portion disposed between another pair of webs and extending between the heat transfer surface and the outlet manifold so as to direct the working fluid flow away from the heat transfer surface in a direction substantially normal thereto; and wherein the heat transfer structure is disposed within the at least one interconnecting channel between the pairs of webs and extends at least partially within both the first portion and the second portion so as to transfer heat between the working fluid and the heat transfer surface in both a first direction as the working fluid flows toward the heat transfer surface in a direction substantially normal thereto, and in a second direction as the working fluid flows away from the heat transfer surface in a direction substantially normal thereto.

2. The heat exchanger of claim 1, wherein the heat transfer structure includes a heat transfer fin disposed in the at least one inlet manifold and the at least one outlet manifold, the fin having a first predetermined area within the inlet manifold and a second predetermined area within the outlet manifold, wherein the area of the fin within the inlet manifold and the outlet manifold is determined according to the desired heat transfer capacity within each of the inlet and outlet manifolds.

3. The heat exchanger of claim 2, wherein the first predetermined area and the second predetermined area are substantially equal such that the heat transfer capacity varies between the inlet manifold and the outlet manifold.

4. The heat exchanger of claim 2, wherein the first predetermined area and the second predetermined area are substantially unequal such that the heat transfer capacity is substantially equal between the inlet manifold and the outlet manifold.

5. The heat exchanger of claim 2, wherein the fin further extends within the interconnecting channel and is formed as a single, unitary structure extending between the inlet manifold, the interconnecting channel and the outlet manifold.

6. The heat exchanger of claim 2, further comprising at least one flow guide tab disposed within the fin, the at least one flow guide tab being constructed and arranged to further direct flow of the working fluid.

7. The heat exchanger of claim 1, further comprising at least one flow partition disposed within one or more of the at least one interconnecting channel, the at least one flow partition constructed and arranged to direct the flow of fluid from one inlet manifold to two or more outlet manifolds.

8. The heat exchanger of claim 1, further comprising an inlet plenum adapted to receive a working fluid into the heat exchanger and an outlet plenum adapted to remove the working fluid from the heat exchanger.

9. The heat exchanger of claim 1, wherein the first and second portions of said at least one interconnecting channel have substantially equivalent cross-sectional areas.

10. The heat exchanger of claim 1, wherein the number of inlet manifolds and the number of outlet manifolds differ.

11. The heat exchanger of claim 1, wherein the heat transfer structure extends within the first portion a first distance and extends within the second portion a second distance, the first and second distances being different.

12. The heat exchanger of claim 1, wherein the heat transfer structure extends within the first portion a first distance and extends within the second portion a second distance, the first and second distances being equal.

* * * * *

UNITED STATES PATENT AND TRADEMARK OFFICE
CERTIFICATE OF CORRECTION

PATENT NO.       : 7,278,474 B2
APPLICATION NO.  : 10/266300
DATED            : October 9, 2007
INVENTOR(S)      : Javier A. Valenzuela and Thomas J. Jasinski It is certified that error appears in the above-identified patent and that said Letters Patent is hereby corrected as shown below:

Claim 3, Column 12, Line 1, "vanes" should read --varies--.

Signed and Sealed this

Fifteenth Day of July, 2008

JON W. DUDAS
*Director of the United States Patent and Trademark Office*